April 30, 1968 R. H. CAMPBELL 3,381,235

AMPLIFIER HAVING FEEDBACK BIAS CONTROL CIRCUIT

Filed March 22, 1965 2 Sheets-Sheet 1

INVENTOR
RICHARD H. CAMPBELL by

Mason, Kolehmainen, Rathburn and Wyss
ATTORNEYS.

April 30, 1968 R. H. CAMPBELL 3,381,235

AMPLIFIER HAVING FEEDBACK BIAS CONTROL CIRCUIT

Filed March 22, 1965 2 Sheets-Sheet 2

INVENTOR
RICHARD H. CAMPBELL
by
Mason, Kolehmainen, Rathburn and Wyss
ATTORNEYS.

3,381,235
AMPLIFIER HAVING FEEDBACK BIAS CONTROL CIRCUIT

Richard H. Campbell, Rockford, Ill., assignor, by mesne assignments, to Webster Electric Company, Inc., Racine, Wis., a corporation of Delaware Filed Mar. 22, 1965, Ser. No. 441,494
6 Claims. (Cl. 330—40)

ABSTRACT OF THE DISCLOSURE

An amplifier includes a transistor connected to amplify signals from a source. Normally the transistor is maintained in a low gain and low current drain standby condition. When input signals exceed a threshold level greater than the line noise level a feedback bias control circuit increases the gain of the transistor for normal amplification operation. The control circuit includes a diode in series with a capacitor, and the forward conduction threshold of the diode establishes the threshold level at which gain is increased.

Figure 1:
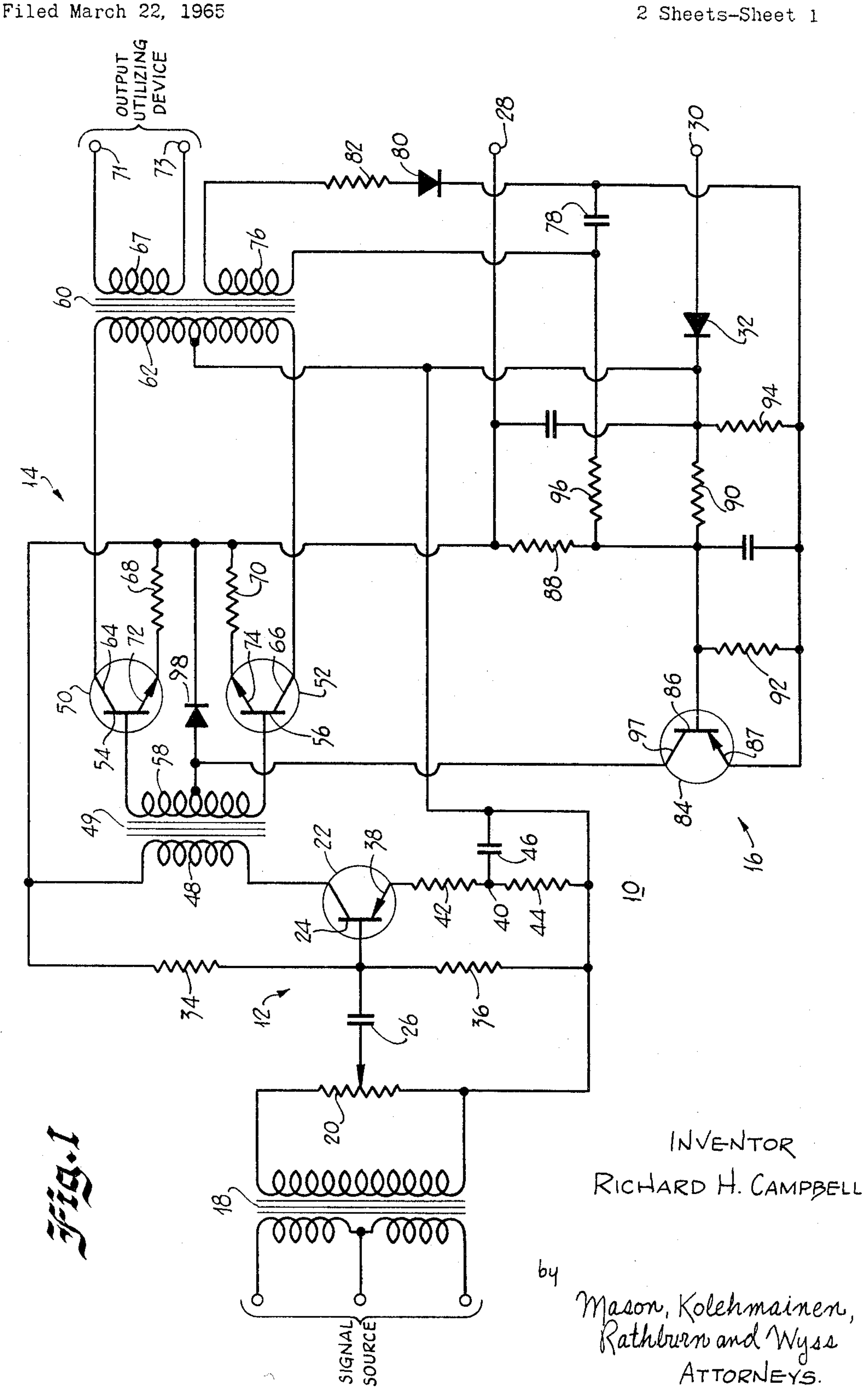

The present invention relates to amplifiers and more particularly to transistorized amplifiers using low standby current.

Amplifiers used in some types of communication systems frequently are used only intermittently. Nevertheless, it may be desirable to maintain such amplifiers in an energized condition over extended periods of time, ready for immediate intermittent use. One amplifier suitable for this purpose is the power amplifier disclosed and claimed in the copending application of Norman H. Reeve, Ser. No. 315,859, filed Oct. 14, 1963, and assigned to the assignee of the present invention, now Patent No. 3,274,508. The power amplifier there disclosed makes use of a pair of beam power tubes for amplification and is designed to be continuously energized from a source of AC power. Furthermore, the amplifier there disclosed includes means for reducing plate dissipation during no-signal or standby periods.

Although the power amplifier disclosed in the above-identified Reeve application is highly useful for its intended purposes, it would be desirable to provide an amplifier of the transistor type, suitable for use with battery power, and requiring low standby power. For example, in some systems, it would be useful to provide an amplifier for use in remote locations which could be powered by a battery. As signals received by such an amplifier may be infrequent, it would be desirable to reduce the current, and thus the battery drain, while maintaining the amplifier in operative condition throughout protracted periods of time. In transistorized battery powered amplifiers used in the past, it has been necessary in order to maintain the amplifier at a point of operation sufficient to minimize distortion to provide a relatively large current to apply a suitable bias voltage to the amplifier circuit. This type of amplifier is unsatisfactory because battery life is severely limited due to the necessity of constantly supplying this magnitude of current.

In some types of communication systems, such as paging systems, amplifiers are provided at various paging stations and are preferably maintained for extended periods of time in condition to amplify incoming signals. However, if such an amplifier is constantly maintained in the high gain, low distortion operating condition necessary for satisfactory amplification, cross-talk and other line noise is amplified during the no-signal standby periods. Since this is undesirable, it has been suggested that the amplifier be placed in the operating condition only when used for paging. Thus, it has been suggested that the amplifier include a relay switching circuit or the like for placing the amplifier in the desired condition, and that a switching signal be transmitted to the amplifier in advance of any paging signal to actuate the switching circuit. However, since such measures are costly and unnecessarily complex, it would be desirable to provide an amplifier that automatically assumes the desired operating condition upon the receipt of a signal to be amplified without the use of relays or other remote switching.

Furthermore, in systems using several amplifiers wherein each amplifier is used only part of the time, it may be desirable that all of the amplifiers be energized from a single power source. Alternatively, battery powered amplifiers may be used, and the batteries charged with a so-called trickle current. In either case it is desirable to reduce the total power consumption of the amplifiers in the system and from this standpoint it is unsatisfactory to maintain each amplifier continuously in the high current consumption operating condition necessary for low distortion amplification. Accordingly, it would be desirable to provide an improved amplifier including circuitry responsive to input signals to be amplified, as distinguished from line noise and the like, for placing the amplifier in an operating condition. In order that the entire incoming signal be amplified, the attack or response time required for this circuitry to act should be very short. Furthermore, after the amplifier is placed in the operative condition, it should be so maintained during relatively low level portions of the incoming signal.

Accordingly, one object of the present invention is to provide a new and improved amplifier.

It is another object of the invention to provide a new and improved transistor amplifier characterized by minimal current drain in the standby condition.

It is another object of the present invention to provide an improved amplifier which will not amplify low level noise signals during periods when no high level information-carrying signals are being received.

It is a further object of the present invention to provide a novel amplifier in which the biasing potential serving to bias the amplifier circuit is automatically changed from a low current, low gain, standby condition to a high gain, low distortion operating condition in response to the receipt of signals exceeding a predetermined threshold magnitude.

It is yet another object of the present invention to provide an improved transistorized battery powered amplifier using little battery current during periods when input signals are not being received, but which is maintained in condition for immediate amplification of incoming signals.

It is another object of the present invention to provide a transistorized amplifier suitable for battery-powered operations at remote points for infrequent emergency signal use.

A further object is to provide an amplifier arrangement in which a transistor amplifier is normally biased to a low gain, low current drain state, and in which means are provided responsive to the presence of an input signal above a threshold value to change the bias to a point at which the transistor amplifier operates with high gain and low distortion.

In accordance with these and many other objects of the invention, an amplifier constructed in accordance with the present invention may comprise a transistor amplifier stage having an input coupled to a signal source and an output connected to a primary winding of an output transformer. In the standby or no-signal condition the amplifier stage is held in a low gain, low current condition by suitable biasing means so that the amplifier requires little standby power. If the amplifier is battery powered, battery life is thus greatly prolonged. In accordance with the invention, a control circuit is provided automatically to alter the biasing of the amplifier stage in order to obtain high gain operation when input signals of a predetermined threshold magnitude are received. If the threshold level is chosen above the line noise or cross talk level, these signals will not be amplified during the standby period.

The control circuit is coupled to the output transformer primary winding and includes a rectifier and capacitor, When the input signals exceed a threshold value, the voltage induced in the control circuit is sufficient to overcome the initially high forward resistance of the rectifier, and current flows through the rectifier rapidly charging the capacitor. The charged capacitor is used in novel fashion to increase the bias on the amplifier stage to achieve high gain, low distortion operation. Furthermore, the control circuit is designed with time constants such that the amplifier stage is maintained in the operating condition for a period of time after the input signals fall below the threshold value, thus assuring that signal portions low in volume are amplified.

More specifically, in one embodiment of the invention the amplifier stage comprises a pair of transistors arranged in push pull configuration. To reduce standby current drain, the transistors are initially biased to a low gain, low current drain, standby condition by means of a high resistance circuit connected across a power source in series with the emitter and base terminals of the transistors. The collector terminals are connected to the primary winding of an output transformer, and the control circuit for changing the biasing is coupled to the output by means of a secondary winding of the output transformer. When an input signal of sufficient magnitude causes the control circuit capacitance to become charged, an additional transistor connected between the potential source and the base terminals is rendered conductive, and an increased biasing potential is applied to the amplifier stage. This results in increased gain whereby increased induced voltage in the control circuit rapidly drives the additional transistor to saturation in a regenerative fashion. Furthermore, the voltage difference between the base and emitter terminals of the push pull transistors is regulated by a diode rectifier connected between these terminals to hold the operating bias in the desired range.

In an alternative embodiment of the present invention, the amplifier stage comprises a single transistor having its base terminal coupled to receive input signals and its emitter terminal in series with a portion of the primary winding of an output transformer. The control circuit includes the entire primary winding, so that the control circuit is coupled to the amplifier stage by autotransformer action. When an input signal of sufficient magnitude causes charging of the control circuit capacitance, the biasing of the transistor is altered to an increased gain condition by means including a resistor interconnecting the control circuit and the base electrode.

Figure 2:
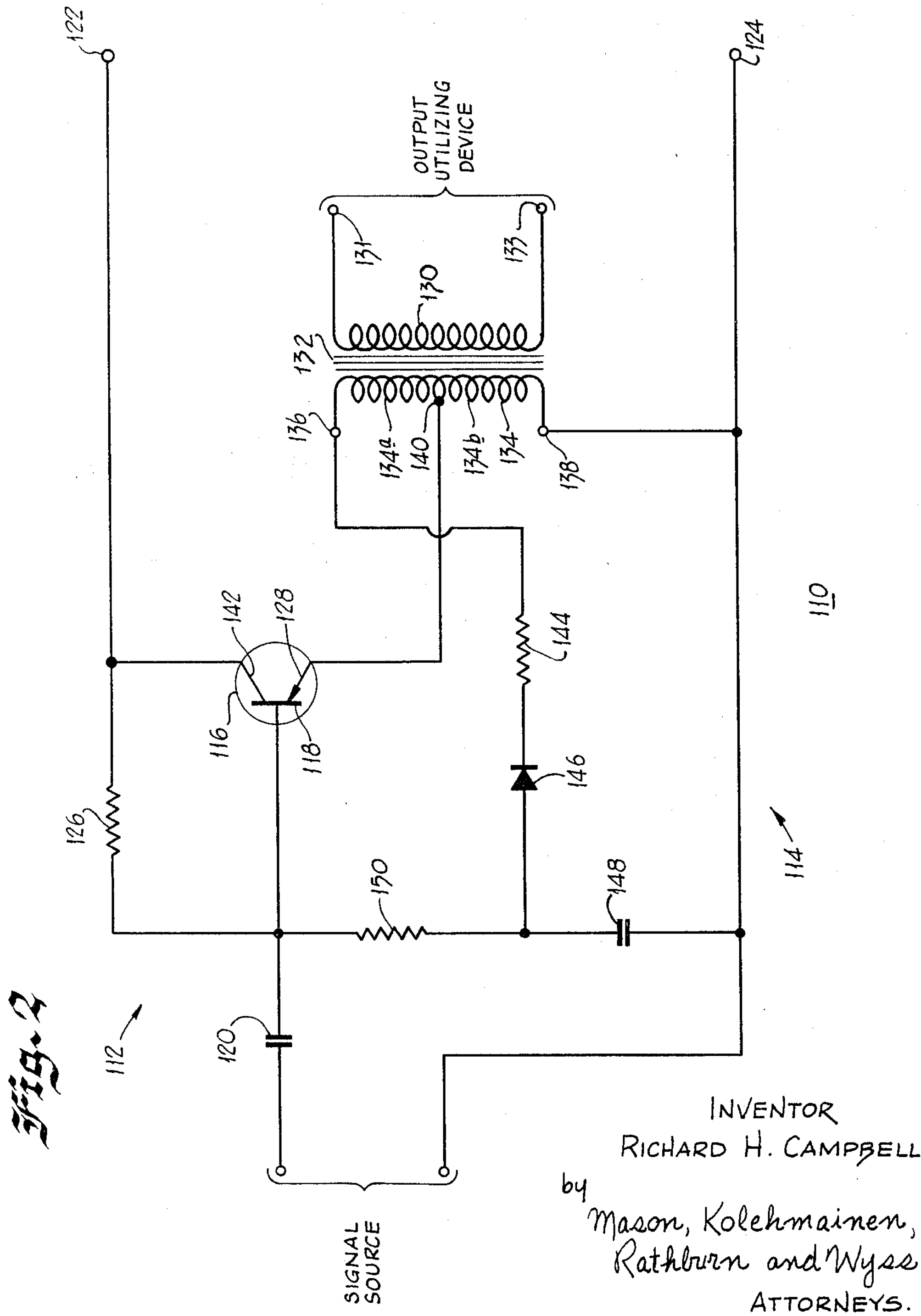

Other objects and advantages of the present invention will appear from considering the following detailed description in conjunction with the drawings, in which:

FIG. 1 is a schematic diagram of an amplifier circuit embodying the present invention; and FIG. 2 is a schematic diagram of an amplifier circuit constituting another embodiment of the present invention.

Having reference now to the drawings and more particularly to FIG. 1, there is illustrated an amplifier constructed in accordance with the present invention and indicated generally as 10. The amplifier 10 is adapted to be connected between a signal source and an output utilizing device, and includes a preamplifier stage 12 and an amplifier stage 14. The amplifier stage 14, in order to minimize standby current drain, is ordinarily only slightly forward biased to a low gain standby or no-signal condition, and the amplifier 10 also includes a control circuit generally designated as 16 for increasing the forward bias in response to the receipt of input signals from the signal source.

Incoming signals from the signal source are coupled to the amplifier 10 through an input transformer 18 and appear across a variable volume control resistor 20. The preamplifier stage 12 includes a PNP type transistor 22 having a base electrode 24 coupled to the variable volume control resistor 20 through a coupling capacitor 26. The amplifier 10 is provided with a pair of terminals 28 and 30 for connection to a suitable potential source, and in the illustrated embodiment of the invention the terminal 28 is negative with respect to the positive terminal 30. For example, if battery-power is used, the terminal 28 may be at minus 24 volts and the terminal 30 at positive 24 volts. A blocking diode 32 is connected in series with the terminal 30 to prevent damage to the amplifier 10 which might otherwise result from improper connection of the potential source. A biasing voltage is applied to the base electrode 24 of transistor 22 by means of a voltage dividing circuit including a pair of resistors 34 and 36, and to an emitter terminal 38 through a biasing network 40 including a pair of resistors 42 and 44 and a capacitor 46.

In order to provide the amplifier stage 14 with a preamplified signal from the preamplifier stage 12, the output circuit of the transistor 22 includes the primary winding 48 of a transformer 49 so that the output of the transistor 22 appears across the winding 48. The amplifier stage 14 includes a pair of NPN transistors 50 and 52 connected in push pull arrangement with their base electrodes 54 and 56 connected to the opposite ends of a secondary winding 58 of the transformer 49.

The amplifier stage 14 includes an output transformer 60 having a primary winding 62 connected between collector electrodes 64 and 66 of the transistors 50 and 52 whereby output signals from the push pull transistors 50 and 52 appear across the primary winding 62. Output signals appearing across primary 62 induce signals in a secondary winding 67 connected between amplifier output terminals 71 and 73.

In the standby or no-signal condition of the amplifier 10, the transistors 50 and 52 are only slightly forward biased by a low voltage initally appearing across a diode 98. A pair of current limiting resistors 68 and 70 are connected between the emitter electrodes 72 and 74 of the transistors 50 and 52 and the potential source. In this standby condition, the transistors 50 and 52 are biased to a low gain condition wherein the current drain, and thus the load on the power source is reduced to a minimum. This is highly desirable in applications of the amplifier 10 wherein a battery is used for the power source.

In accordance with a feature of the invention, means including the control circuit 16 are provided to alter the biasing arrangements of the push pull transistors 50 and 52 is response to receipt of an input signal from the signal source. The control circuit 16 accordingly includes a secondary winding 76 of the output transformer 60 in series with a capacitor 78, a diode rectifier 80 and a current limiting resistor 82.

It should be understood that the signal source might comprise a remote transmitting device interconnected with the transformer 18 by means of a transmission line or the like. In this instance relatively low level noise signals, cross talk and the like may be constantly received by the amplifier 10 only intermittently displaced by higher level input signals. Any signals received by the transformer 18 will be preamplified in the preamplifier stage 12 and amplified to some very small extent by the amplifier stage 14. When only noise and cross talk are being received, the voltage induced in the secondary winding 76 is not sufficient to cause current to flow through the diode rectifier 80. However, when an input signal from a signal source exceeds a threshold level determined by the preamplifier and amplifier characteristics and by the characteristics of the diode rectifier 80, the voltage induced in the secondary 76 overcomes the initially great forward resistance of the diode rectifier 80 causing current to flow charging the capacitor 78. As will be described in detail, charging of the capacitor 78 causes the control circuit 16 to alter the biasing of the amplifier 10 from the standby low gain condition to a high gain operating condition. Thus, it can be seen that the amplifier 10 in accordance with the invention has the desirable characteristic of not amplifying line noise and cross talk.

In order to alter the biasing arrangement of the amplifier stage 14 in response to a build up of charge across the capacitor 78, the control circuit 16 includes a PNP type transistor 84 initially biased to a non-conductive state by means of a biasing voltage applied to the base terminal 86 thereof through a voltage dividing network including resistors 88, 90, 92 and 94. When a potential difference is developed across the capacitor 78, the transistor 84 is biased to a conductive state since one side of the capacitor 78 is connected to the base terminal 86 through a resistor 96 while the other side of the capacitor 78 is connected to the emitter electrode 87.

In order to alter the biasing arrangement of the amplifier stage 14, the collector electrode 97 of the transistor 84 is connected to the base electrodes 54 and 56 through a center tap of the secondary winding 58 of the transformer 50. Thus it can be seen that when an input signal over the threshold level is received by the amplifier 10, operation of the control circuit 16 is effective to apply a positive potential to the base electrodes 54 and 56 of the push pull transistors 50 and 52, thus increasing the forward biasing of the amplifier stage 14. The increase in the biasing potential applied to the amplifier stage results in increased gain so that increased voltage is induced in the control circuit 16 and transistor 84 is rendered more conductive. This action continues in regenerative fashion until the transistor 84 is driven to saturation. The diode rectifier 98 connected between the base electrodes 54 and 56 and the negative terminal 28 of the amplifier 10 now serves to control the biasing of the transistors 50 and 52 in order that, in the operating condition, they operate in the desired range. Thus for example, the maximum potential drop across the rectifier 98 is in the order of slightly less than one volt.

In view of the preceding detailed description of the amplifier 10 constructed in accordance with the invention, its operation will be apparent to those skilled in the art. In the standby condition the amplifier stage 14 is only slightly forward biased to a standby condition characterized by low gain and low current drain upon the potential source connected to terminals 28 and 30. Upon receipt of an input signal above a threshold level, a voltage appearing across secondary winding 76 of the output transformer 60 serves to charge the capacitor 78 and actuate the control circuit 16. This results in a rapid changing of the bias on the transistors 50 and 52 to a point on their operating characteristics characterized by high gain and very low distortion. In a device constructed in accordance with the present invention, in the operating condition, the push pull amplifier stage 14 functioned as a class AB amplifier. The attack time of the control circuit 16 is very short, and the RC time constant of the circuits including the capacitor 78 prevent the capacitor from discharging immediately to the end that the circuit remains in the operating condition for a period of time, approximately 15 seconds or so, after the input signal falls below the threshold level. This assures continuous amplification of input signals having low level portions or pauses therein.

Referring now to FIG. 2, there is illustrated an alternative embodiment of the present invention comprising an amplifier designated generally as 110. The amplifier 110 includes an amplifying stage 112 that is normally biased to a low gain and low current drain condition, and additionally includes a control circuit 114 for altering the biasing arrangement of the amplifying stage 112 in response to the receipt of input signals from a signal source.

The amplifying stage 112 includes a single PNP type transistor 116 having a base electrode 118 coupled to the signal source by means of a coupling capacitor 120.

In order to bias the transistor 116 to a standby or no-signal condition characterized by low gain and low static current drain, the amplifier includes a pair of terminals 122 and 124 adapted for connection to a suitable battery or other potential source. For example, if a battery is used, the terminal 122 may be at a potential of minus 12 volts and the terminal 124 at a potential of plus 12 volts. Biasing of the transistor 116 is accomplished by means of a biasing circuit including a resistor 126 and the interelectrode resistance between the base electrode 118 and an emitter electrode 128 of the transistor 116. The value of the resistance 126 is of sufficient magnitude so that a substantial portion of the voltage drop across the biasing circuit exists across the resistance 126 rather than between the electrodes 118 and 128. Accordingly, the desired low current drain standby bias is achieved.

The output of the implifier 110 appears across a portion **134*b* of a primary winding 134 of an output transformer 132. The primary winding 134 is provided with end terminals 136 and 138 and is divided into two portions 134*a* and 134*b* by a center tap 40. Additionally, the output transformer 132 includes a secondary winding 130 connected between a pair of output terminals 131 and 133. The output circuit of the amplifier stage 112 includes the collector electrode 142 of the transistor 116, the emitter electrode 128 and the winding portion 134*b*, whereby signals amplified by the amplifier stage 114 are coupled to the output across the transformer 132**.

In accordance with a feature of the invention, output signals from the amplifier stage 112 are coupled to the control circuit 114 by autotransformer action. Accordingly, the control circuit 114 is connected to terminals 136 and 138 and thus includes the entire primary winding 134, while the amplifier output is connected only across portion **134*b*. For example, the ratio of turns in the winding portion 134*b* to turns in the winding portion 134*a* may be in the order of about 2 to 1. Input signals received by the amplifying stage 112 will be amplified to some very small extent by the transistor 116 even when biased to the standby condition. Resulting output signals appearing across the winding portion 134*b* will induce a voltage across the entire primary winding 134 tending to cause current flow in the control circuit 114 which includes a resistance 144, a diode rectifier 146, and a capacitor 148. When the voltage drop thus created across the diode rectifier 146 is sufficient to overcome the initially high resistance of the diode, current flows through the circuit charging the capacitor 148. This results in an additive biasing voltage being applied to the base terminal 118 of the transistor 116 through a resistor 150, thus increasing the base current. As the input signal increases, the circuit of resistor 144, diode 146 and capacitor 148 supplies an increasing higher base current. The circuit parameters are chosen so that the control circuit 114 supplies enough base current to provide low output distortion. Furthermore, distortion is minimized by arranging the transistor 116 in a so-called grounded collector configuration with the collector electrode 142** tied to the negative side of the potential source.

It should be understood that the amplifier 110 differs from the amplifier 10 in that the control circuit 114 does not immediately regeneratively bias the transistor 116 to a high gain condition once the threshold level input is exceeded. Rather the control circuit 114 causes a substantially uniform change in the operating point of the transistor 116 with increasing input.

Although the present invention has been described with reference to particular illustrative embodiments thereof, it should be understood that numerous other modifications and embodiments can be devised by those skilled in the art that will fall within the spirit and scope of the principle of this invention.

What is claimed as new and desired to be secured by Letters Patent of the United States is:

1. An amplifier for use with a signal source of the type supplying low level noise signals and intermittent higher level information signals, said amplifier comprising:

a transistor including a control electrode and a pair of output electrodes;

means coupling said control electrode to the signal source;

an output transformer having a first winding coupled to said output electrodes;

biasing means coupled to at least one of said output electrodes for normally operating said transistor in a standby condition characterized by low gain and low current drain;

additional transformer winding means coupled electromagnetically to said first winding for developing an induced voltage in accordance with the output signal of said transistor;

a capacitor in series with said additional winding means;

a diode in series with said capacitor and having a conduction threshold such that said capacitor is charged only in response to output signals of a predetermined level corresponding to input signals having a level greater than the low level noise signals;

and circuit means connected between said capacitor and said control electrode for applying bias signals to said control electrode in accordance with the charge level of said capacitor thereby to alter the bias condition of said transistor toward an operating condition characterized by increased gain.

2. The amplifier of claim 1, said additional winding means comprising an autotransformer winding including said first winding.

3. The amplifier of claim 1, said additional winding means comprising a secondary winding of said transformer, and said circuit means including an amplifier device coupled between said capacitor and said control electrode for increasing the power of said bias signals.

4. The amplifier of claim 3 further comprising an additional diode connected between said control electrode and a point of reference potential for preventing said bias signals from increasing the gain of said transistor above a predetermined level.

5. An amplifier for use with a signal source of the type supplying low level noise signals and intermittent higher level information signals, said amplifier comprising:

first and second transistors connected in push pull configuration, and each including a base, an emitter and a collector electrode;

means coupling said base electrodes to the signal source;

biasing means coupled to said emitter and collector electrodes for normally operating said transistors in a standby condition characterized by low gain and low current drain;

an output transformer having a primary winding coupled to said collector electrodes;

a secondary winding coupled electromagnetically to said primary winding for developing an induced voltage in accordance with the output signal of said transistors;

a series circuit loop including said secondary winding, a capacitor and a diode;

said diode having a conduction threshold characteristic such that said capacitor is charged only in response to output signals of a predetermined level corresponding to input signals having a level greater than the low level noise signals;

a third transistor having a base electrode and a pair of output electrodes;

means coupling said capacitor to said base electrode of said third transistor to control the conductivity of said third transistor in accordance with the charge of said capacitor;

and means connecting the base electrodes of said first and second transistor to an output electrode of said third transistor for increasing the gain of said first and second transistors in response to charging of said capacitor.

6. The amplifier of claim 5 further comprising an additional diode connected between said base electrodes of said first and second transistors and a point of reference potential to maintain the gain of said first and second transistors below a predetermined point.

References Cited

UNITED STATES PATENTS

| | | | |
|---|---|---|---|
| 2,777,057 | 1/1957 | Pankove | 330—22 X |
| 3,015,075 | 12/1961 | Bargellini | 330—22 X |

ROY LAKE, *Primary Examiner.*

L. J. DAHL, *Assistant Examiner.*